(12) United States Patent
Hui et al.

(10) Patent No.: US 7,985,687 B1
(45) Date of Patent: Jul. 26, 2011

(54) SYSTEM AND METHOD FOR IMPROVING RELIABILITY IN A SEMICONDUCTOR DEVICE

(75) Inventors: Angela T. Hui, Fremont, CA (US); Hiroyuki Kinoshita, San Jose, CA (US); Unsoon Kim, San Jose, CA (US); Harpreet K. Sachar, Milpitas, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 1660 days.

(21) Appl. No.: 11/186,969

(22) Filed: Jul. 22, 2005

(51) Int. Cl.
*H01L 21/302* (2006.01)

(52) U.S. Cl. .......... 438/704; 438/697; 438/778

(58) Field of Classification Search .......... 438/706, 438/710, 714, 717, 723, 724, 725, 745, 757
See application file for complete search history.

(56) References Cited

U.S. PATENT DOCUMENTS

| | | | | |
|---|---|---|---|---|
| 6,780,708 B1 * | 8/2004 | Kinoshita et al. | | 438/241 |
| 7,220,643 B1 * | 5/2007 | Wada et al. | | 438/257 |
| 2002/0134754 A1 * | 9/2002 | Kim | | 216/39 |
| 2004/0132292 A1 * | 7/2004 | Mariani et al. | | 438/689 |
| 2005/0067101 A1 * | 3/2005 | Funabashi | | 156/345.18 |
| 2005/0176219 A1 * | 8/2005 | Kim et al. | | 438/479 |
| 2005/0191764 A1 * | 9/2005 | Yates et al. | | 438/3 |
| 2005/0263488 A1 * | 12/2005 | Change et al. | | 216/83 |
| 2006/0170029 A1 * | 8/2006 | Liu et al. | | 257/315 |

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

Primary Examiner — Allan Olsen
(74) Attorney, Agent, or Firm — Harrity & Harrity, LLP

(57) ABSTRACT

A method for forming a memory device includes forming a hard mask over a substrate, where the hard mask includes a first mask layer and a second mask layer formed over the first mask layer. The substrate is etched to form a trench. The trench is filled with a field oxide material. The second mask layer is stripped from the memory device using a first etching technique and the first mask layer is stripped from the memory device using a second etching technique, where the second etching technique is different than the first etching technique.

18 Claims, 8 Drawing Sheets

SYSTEM AND METHOD FOR IMPROVING RELIABILITY IN A SEMICONDUCTOR DEVICE

TECHNICAL FIELD

The present invention relates generally to semiconductor manufacturing and, more particularly, to fabrication of memory devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells must be erased together as a block.

Flash memory devices of this type may include individual memory cells characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

Memory cells in a flash memory device are typically connected in an array of rows and columns, with the control gates of the cells in a row being connected to a respective word line and the drains of the cells in a column being connected to a respective bit line. To operate efficiently and reliably, each cell must be effectively isolated from neighboring cells.

As the dimensions of such memory devices have shrunk, isolation techniques have transitioned from conventional local oxidation of silicon ("LOCOS") isolation techniques to shallow trench isolation ("STI"). In fabricating an STI structure, a trench is created in the substrate between active regions of neighboring cells. The trench is filled with a field oxide (FOX) material which isolates neighboring cells from each other. Unfortunately, conventional STI fabrication techniques fail to provide suitably efficient and reliable isolation.

Accordingly, there is a need for an improved STI structure and fabrication technique for optimizing performance of flash memory devices.

DISCLOSURE OF THE INVENTION

In an implementation consistent with the principles of the invention, a method for forming a memory device is provided. The method includes forming a hard mask over a substrate, where the hard mask includes a first mask layer and a second mask layer formed over the first mask layer. The substrate is etched to form a trench. The trench is filled with a field oxide material. The second mask layer is stripped from the memory device using a first etching technique and the first mask layer is stripped from the memory device using a second etching technique, where the second etching technique is different than the first etching technique.

In another implementation consistent with the principles of the invention, a method is provided for fabricating a semiconductor device. The method includes: forming a first dielectric layer over a substrate; forming a second dielectric layer over the first dielectric layer; forming an anti-reflective dielectric layer over the first dielectric layer; forming a photoresist layer over the anti-reflective dielectric layer; patterning the photoresist layer to define mask regions; etching the anti-reflective dielectric layer and the second dielectric layer to form a hard mask; etching the substrate and the first dielectric layer to form at least one isolation trench in portions of the substrate not covered by the hard mask; filling the trench with an oxide material; stripping the anti-reflective dielectric layer from the semiconductor device; stripping the second dielectric layer from the memory device; forming at least one charge storage element over the oxide material and the first dielectric layer; forming an inter-gate dielectric layer over the at least one charge storage element; and forming at least one control gate over at least a portion of the inter-gate dielectric layer.

In yet another implementation consistent with the principles of the invention, a method is provided for fabricating a memory device. The method includes forming an oxide layer over a substrate. A nitride layer is formed over the oxide layer. An anti-reflective silicon oxynitride layer is formed over the nitride layer. The anti-reflective silicon oxynitride layer and the nitride layer are patterned and etched to form a mask. The oxide layer and the substrate are etched using the mask to form at least one isolation trench. A field oxide material is formed in the at least one isolation trench. The anti-reflective silicon oxynitride layer is removed using dry plasma etching. The nitride layer is removed using wet phosphoric acid etching. At least one charge storage element is formed over the oxide layer and the field oxide material. The field oxide material is recessed to a predetermined depth using the at least one charge storage element as a mask. An inter-gate dielectric layer is formed over the at least one charge storage element and the recessed field oxide material. At least one control gate is formed over the inter-gate dielectric layer.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements.

Also, the following detailed description does not limit the invention. Instead, the scope of the invention is defined by the appended claims and their equivalents.

Figure 1:
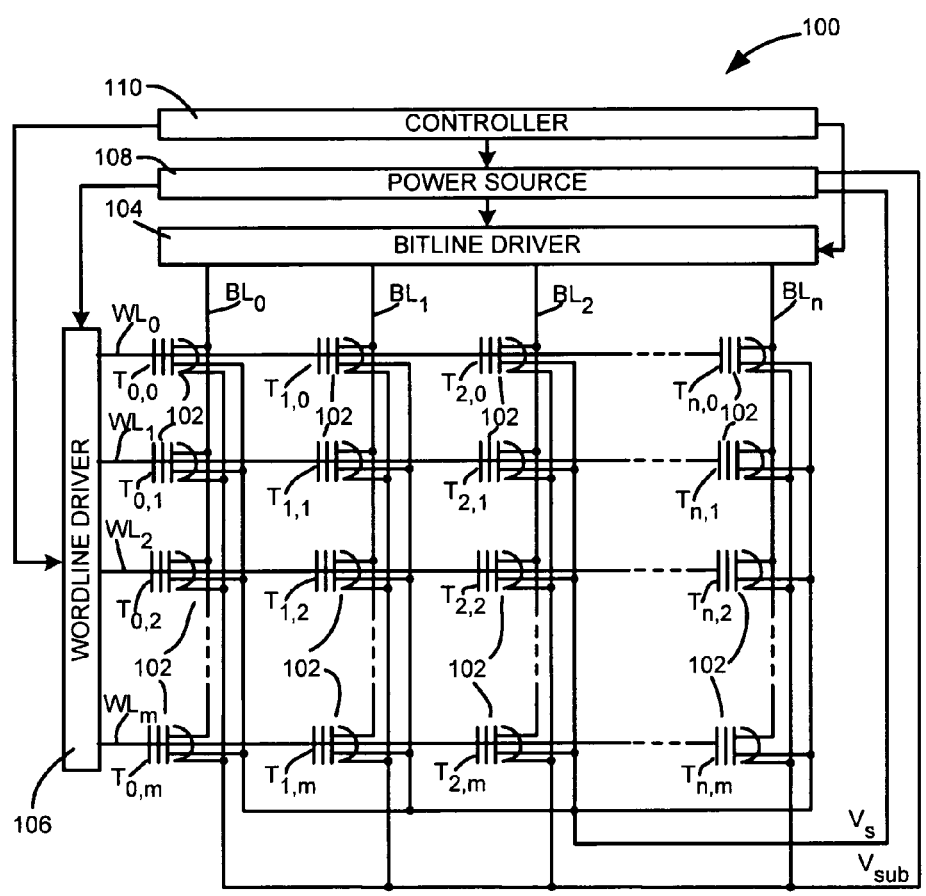
FIG. 1 illustrates an exemplary configuration of a flash EEPROM 100 formed in accordance with an embodiment of the present invention.

Implementations consistent with the present invention provide non-volatile memory devices with improved lithographic spacing, such as flash electrically erasable programmable read only memory (EEPROM) devices. FIG. 1 illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. The controller 110 may also control the drivers 104 and 106 to address the memory cells individually or collectively.

A memory cell 102 is located at each junction of a word line and a bit line. Each cell 102 includes a Metal-Oxide-Semiconductor (MOS) Field Effect Transistor (FET) having a source and drain formed in a semiconductor substrate, a floating gate, and a control gate separated from the floating gate by an oxide-nitride-oxide (ONO) stack. Additional details regarding the formation of cell 102 will be described below in relation to FIGS. 2-14. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to the power source 108.

Exemplary Processing

Figure 2:
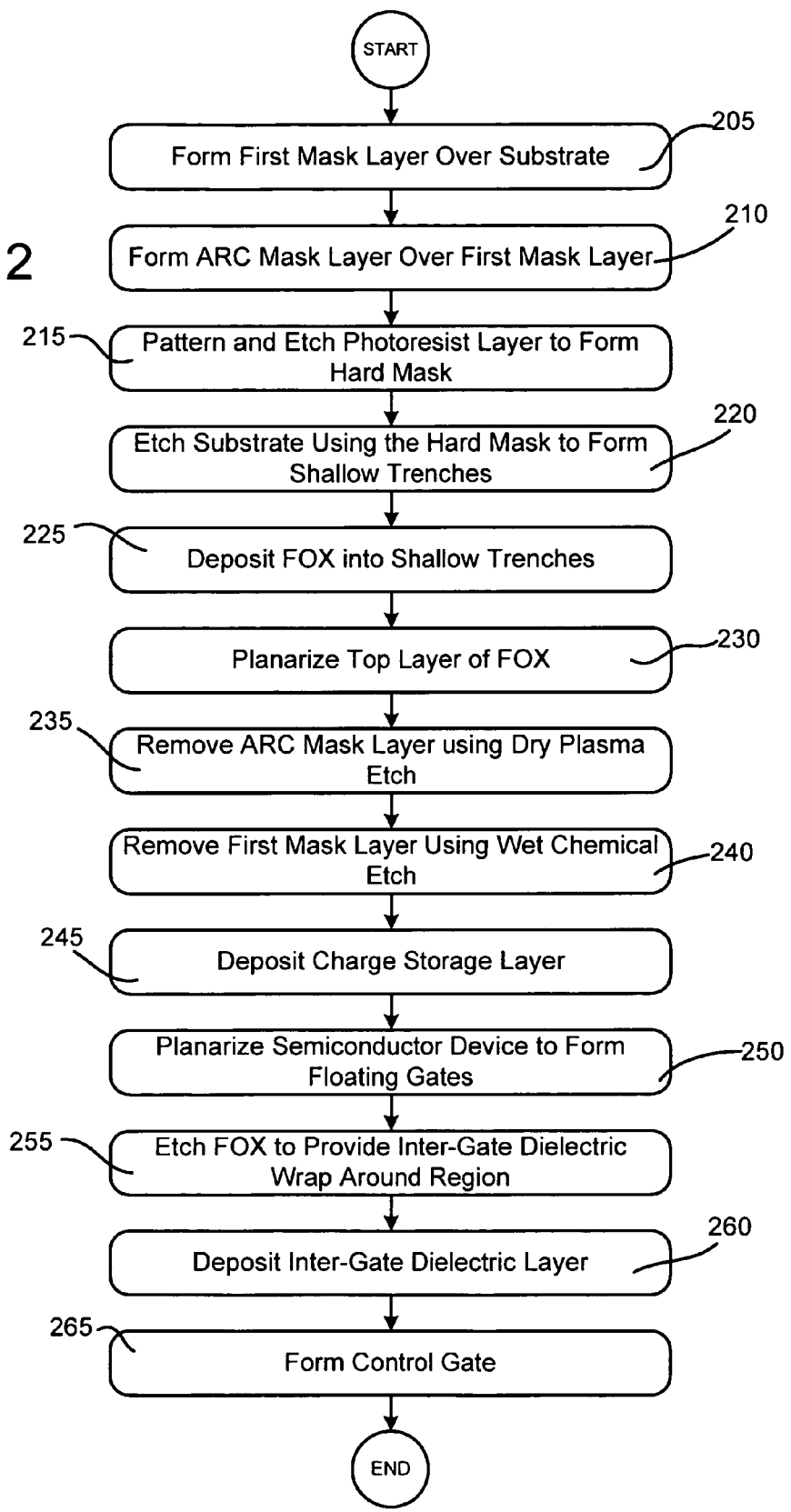
FIG. 2 is a flow diagram illustrating an exemplary process for forming a semiconductor memory device in an implementation consistent with the principles of the invention.

FIG. 2 illustrates an exemplary process for forming a semiconductor memory device in an implementation consistent with the principles of the invention. In one implementation, the semiconductor memory device includes an array of memory cells of a flash memory device, such as that illustrated in FIG. 1. FIGS. 3-14 illustrate exemplary views of a semiconductor memory device fabricated according to the processing described in FIG. 2.

Figure 3:
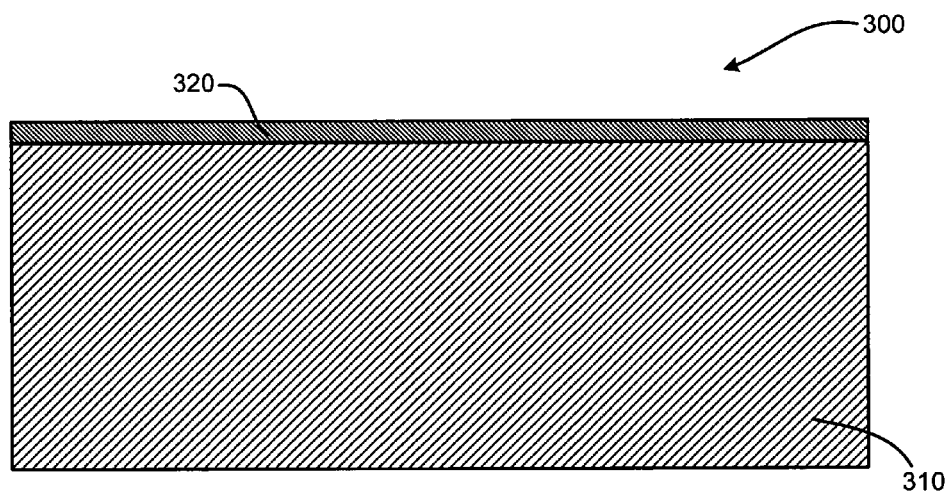
FIGS. 3-14 illustrate exemplary views of a semiconductor memory device fabricated according to the processing described in FIG. 2.

With reference to FIGS. 2 and 3, processing may begin with a semiconductor device 300 that includes layers 310 and 320. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a dielectric layer formed on layer 310 in a conventional manner. In an exemplary implementation, dielectric layer 320 may include an oxide, such as a silicon oxide (e.g., $SiO_2$), and may have a thickness ranging from about 50 Å to about 350 Å. Dielectric layer 320 may function as a tunnel oxide layer for a subsequently formed memory cell of semiconductor device 300. In one implementation consistent with principles of the invention, a suitable method for forming layer 320 may be a thermal oxidation process of layer 310 at a temperature of about 750° C. to 1100° C. Alternatively, dielectric layer 320 may be deposited using a low pressure chemical vapor deposition (LPCVD) process performed at a temperature of about 400° C. to 800° C. In addition, an optional nitride layer (not shown) may be formed on layer 320.

A hard mask 410 may be formed over layer 320 (act 205-210). In one exemplary implementation, hard mask 410 may incorporate two distinct layers, an initial mask layer 420 (act 205) and a second, anti-reflective coating (ARC) layer 430 formed above mask layer 420 (act 210). By providing anti-reflective coating layer 430 beneath a photoresist material prior to formation of the mask 410, optical reflections of the radiation used to develop the mask pattern may be minimized. By using ARC layer 430, more precise lithography may be applied, resulting in narrower mask spacings. In one embodiment, mask layer 420 may be formed of a dielectric, such as silicon nitride (e.g., $Si_3N_4$), and may have a thickness ranging from about 800 Å to about 1700 Å. Additionally, in one exemplary implementation, ARC mask layer 430 may be formed of silicon oxynitride (e.g., SiON), and may have a thickness ranging from about 300 Å to about 700 Å.

Figure 4:
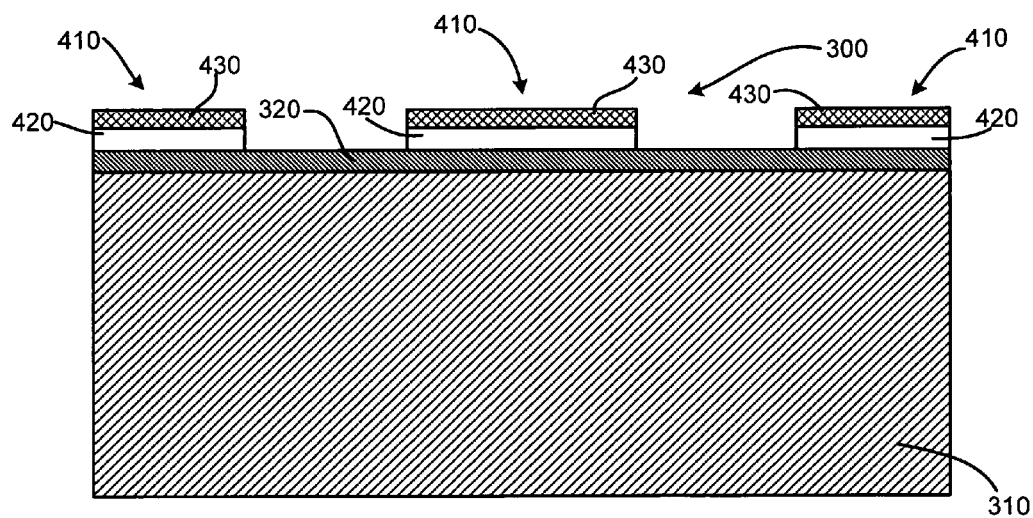

A photoresist material formed over mask layers 420 and 430 may be patterned and etched in a conventional manner to form hard mask 410 on the top surface of layer 320, as illustrated in FIG. 4 (act 215). Mask 410 may be used to define active regions in the subsequently formed memory device and indicate areas that will not be etched during formation of isolation regions in semiconductor device 300.

Figure 5:
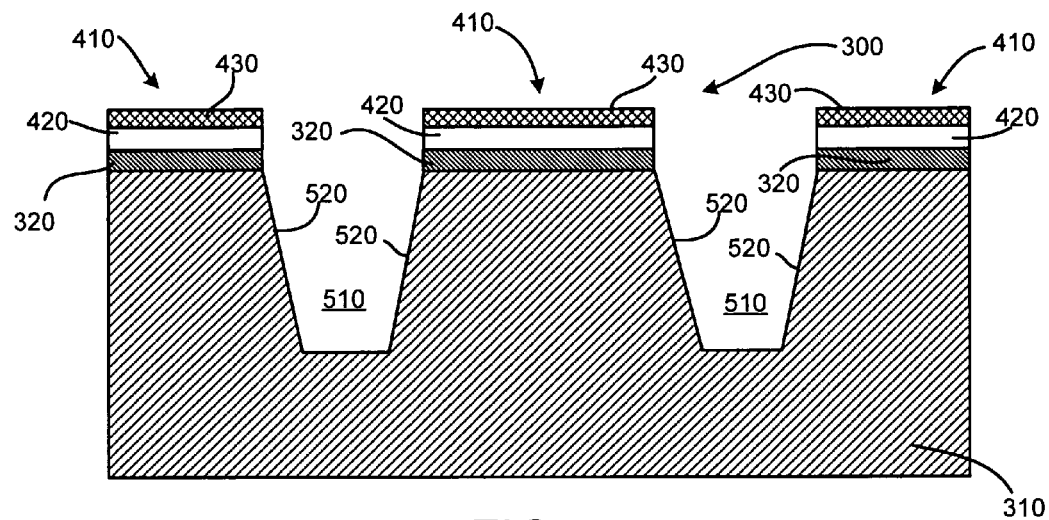
Figure 6:
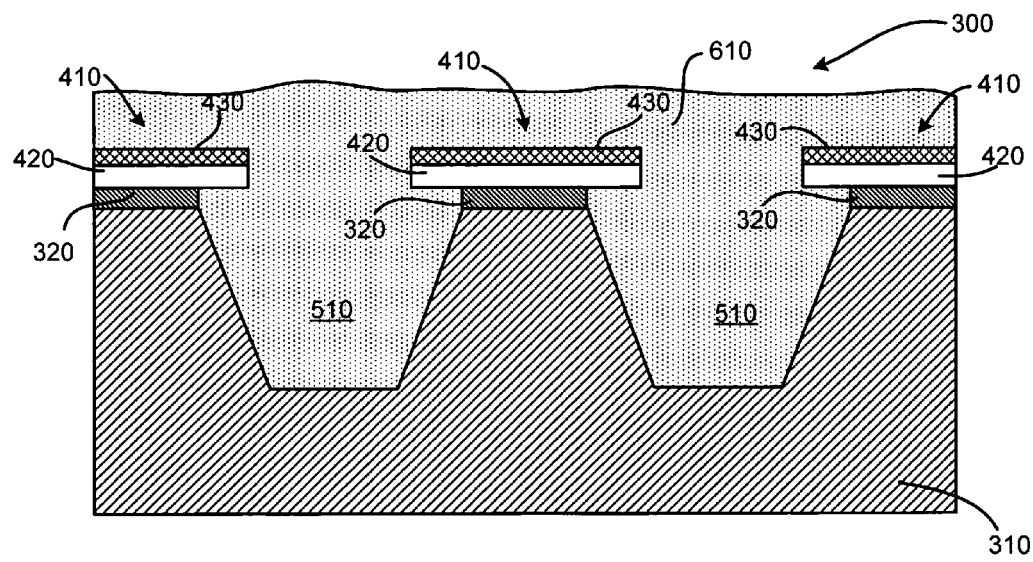
Figure 7:
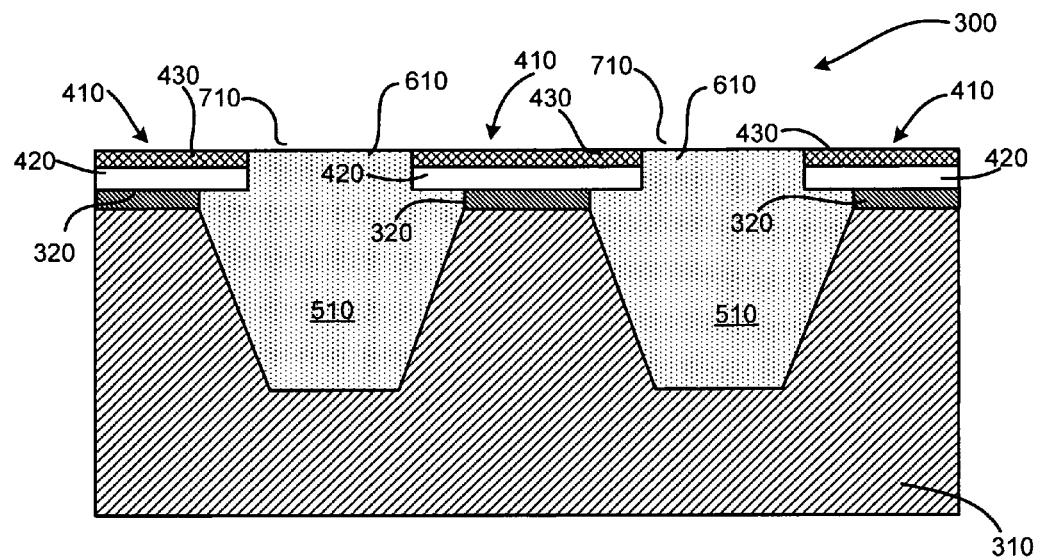

Semiconductor device 300 may then be etched, as illustrated in FIG. 5, to remove portions of layers 310 and 320, thereby forming shallow trenches 510 (act 220). The etch may also be referred to as a shallow trench isolation (STI) etch. A field oxide (FOX) layer 610 may then be deposited into trenches 510, as illustrated in FIG. 6 (act 225). In one implementation consistent with principles of the invention, FOX layer 610 may be deposited by high density plasma chemical vapor deposition (HDP CVD), although suitable alternative deposition techniques may also be employed. FOX layer 610 may also be planarized using, for example, a chemical mechanical polishing (CMP) process to form a planar top surface 710 and to expose the upper surface of mask 410, as illustrated, in FIG. 7 (act 230). After the CMP process, the top surface of FOX layer 610 may be substantially planar with the top surface of mask layer 410.

Figure 8:
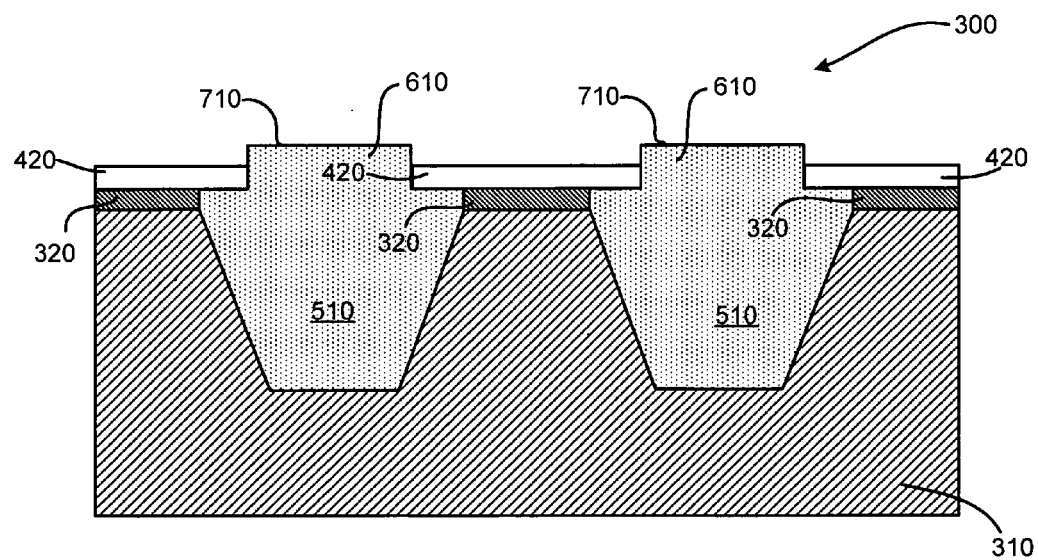

Following trench and FOX layer formation, semiconductor device 300 may then be etched, as illustrated in FIG. 8, to remove or strip ARC layer 430 (act 235). In one exemplary implementation, ARC layer 430 may be etched using a dry plasma etching technique using, for example, a fluorinated hydrocarbon gas, such as e.g., $CH_3F$, $CHF_3$, and $CH_2F_2$ having high selectivity for removing only the SiON ARC mask layer 430 without substantially etching FOX layer 610. According to an exemplary embodiment of the present invention, the semiconductor device 300 illustrated in FIG. 7 may be placed in a conventional plasma etching chamber. A $He/O_2/CHF_3$ etch chemistry may then be used to perform the plasma etching. For example, to etch SiON ARC mask layer 430 having a thickness ranging from about 300 Å to 700 Å, He may be provided at a flow rate ranging from about 50 standard cubic centimeters per minute (sccm) to about 300 sccm, $O_2$ may be provided at a flow rate ranging from about 0 sccm to about 50 sccm and $CHF_3$ may be provided at a flow rate ranging from about 10 sccm to about 60 sccm. In addition, an RF power source for the plasma etching chamber may be set to provide power ranging from about 100 watts to about 500 watts and a bias voltage ranging from about 100 volts to about 300 volts may be applied to the semiconductor device 300.

In an alternative embodiment, an $Ar/O_2/CH_3F$ etch chemistry may be used to perform the plasma etching. For example, to etch SiON ARC mask layer 430 having a thickness ranging from about 300 Å to 700 Å, Ar may be provided at a flow rate ranging from about 100 sccm to about 400 sccm, $O_2$ may be provided at a flow rate ranging from about 40 sccm to about 150 sccm and $CH_3F$ may be provided at a flow rate ranging from about 10 sccm to about 60 sccm. In addition, the RF power source for the plasma etching chamber may be set to provide power ranging from about 100 to about 500 watts and a bias voltage ranging from about 100 to about 300 volts may be applied to the semiconductor device 300.

It should be understood that the particular etch chemistry, flow rates, RF power, wafer bias voltage, etching duration and other parameters may be optimized based on the particular semiconductor device being etched, the particular plasma etching chamber used and the guidance disclosed herein.

Figure 9:
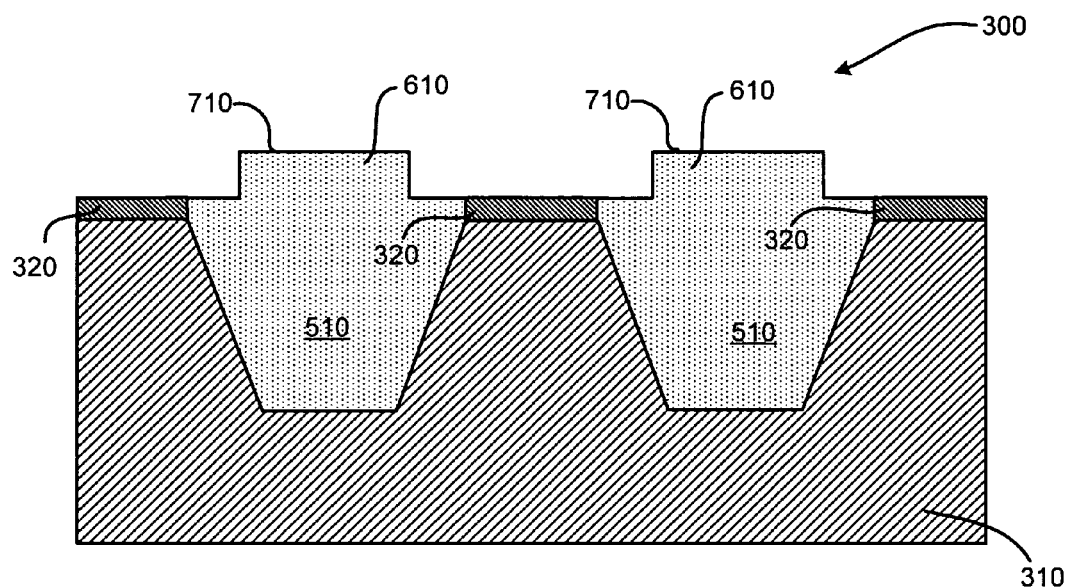

Semiconductor device 300 may then be etched, as illustrated in FIG. 9, to strip first mask layer 420 (act 240). In one exemplary implementation, mask layer 420 may be etched using a wet etching technique using, for example, phosphoric acid, to limit the etching to only mask layer 420 (e.g., nitride) without damaging layer 320 or FOX layer 610. Limiting damage to layer 320 and FOX layer 610 advantageously enables the subsequently formed source/drain regions to be formed in substrate 310 in a more uniform manner. Following etching of mask layers 420 and 430, a portion of FOX layer 610 forms a protrusion above the surface of trenches 510, as illustrated in FIG. 9.

Figure 10:
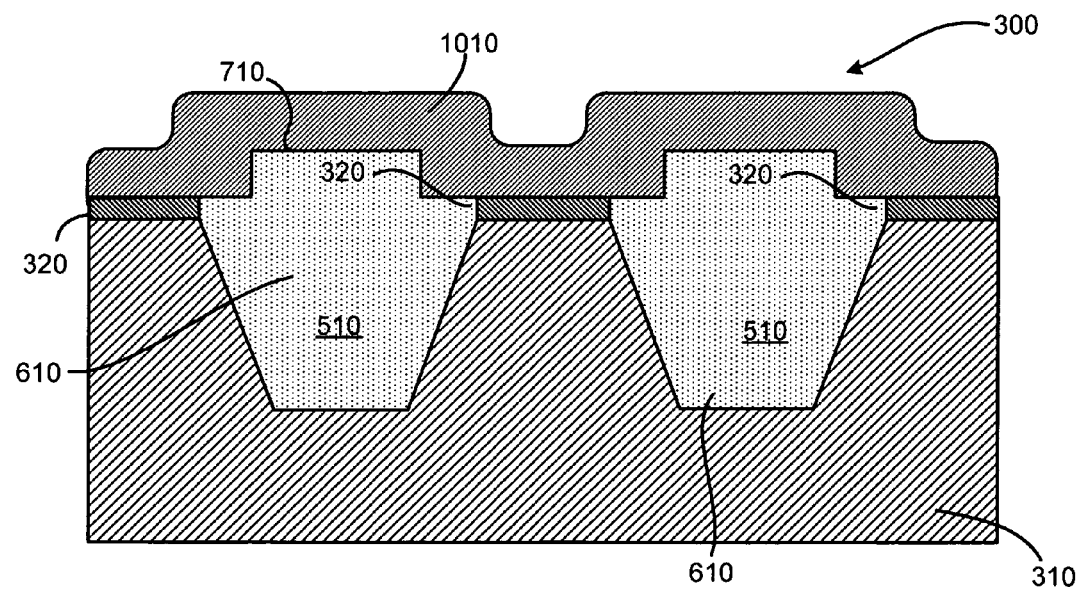

A layer 1010 may be formed on layer 320 and field oxide layer 610 in a conventional manner and may include a conductive material, such as polysilicon or a dielectric material, such as silicon nitride, as shown in FIG. 10 (act 245). Layer 1010, consistent with principles of the invention, may act as a charge storage layer for semiconductor device 300 and may have a thickness ranging from about 400 Å to about 900 Å.

Figure 11:
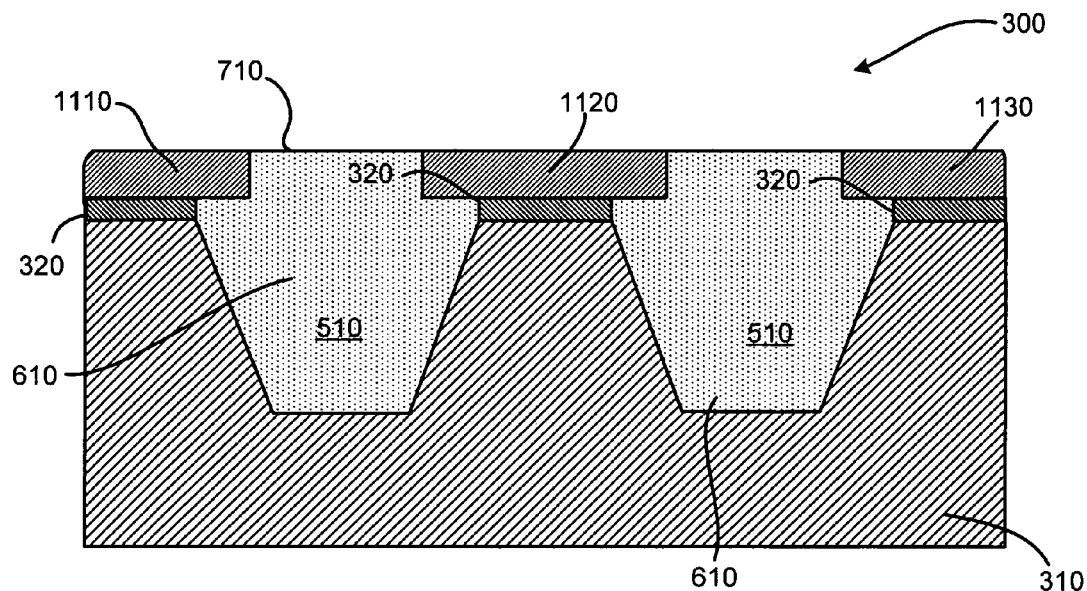

A planarization process may then be performed to remove a predetermined amount of excess material from layer 1010 and FOX layer 610, as illustrated in FIG. 11, thereby forming floating gates 1110, 1120, and 1130 (act 250). Floating gates 1110, 1120, and 1130 may represent floating gate electrodes of separate memory cells in semiconductor device 300. For example, a CMP may be performed to remove the desired portions of layers 1010 and 610. Layers 1010 and 610 may also be planarized by an etch back or other suitable planarization technique.

Figure 12:
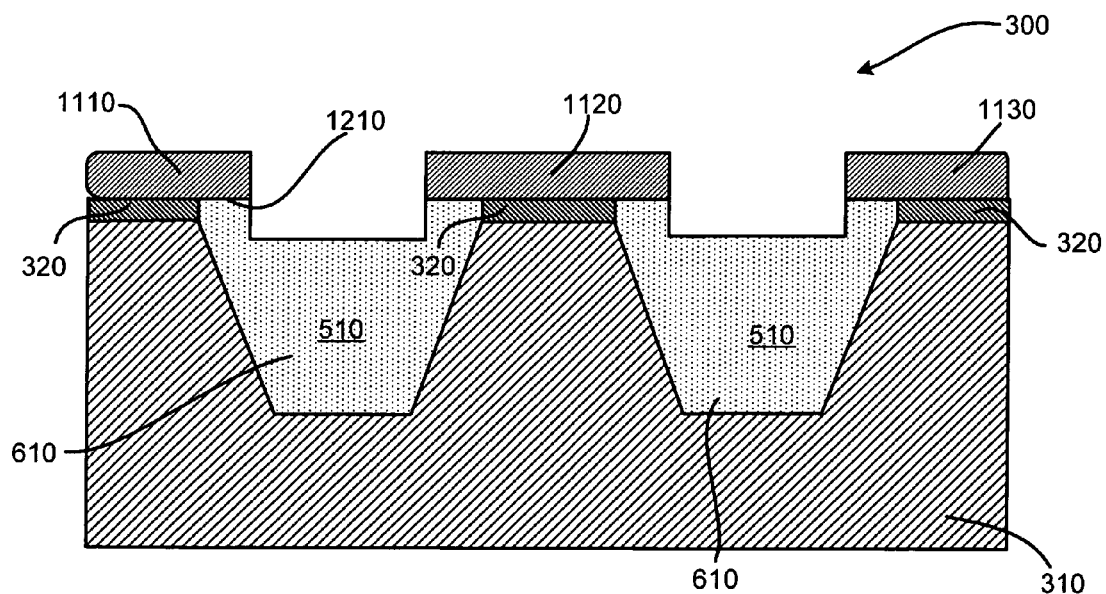

Following planarization, FOX layer 610 may be etched to a predetermined depth using floating gates 1110, 1120, and 1130 as the etching masks, as illustrated in FIG. 12, to remove portions of field oxide layer 610 and provide a region for an inter-gate dielectric material to wrap around floating gates 1110, 1120, and 1130 (act 255). In one implementation consistent with principles of the invention, this etching is performed using a dry, high selective oxide, plasma etch, wherein plasma ions are used to bombard the surface of layer 610 and etch away a desired amount of material. Moreover, dry plasma etching is anisotropic in nature, thereby preventing undesirable undercutting of floating gates 1110, 1120, and 1130 and lateral portions of FOX layer 610, resulting in improved resistance to leakage through a subsequently formed dielectric stack. In one implementation consistent with principles of the invention, FOX layer 610 may be etched to a level below a lower surface 1210 of floating gates 1110, 1120, and 1130, as shown in FIG. 12.

Figure 13:
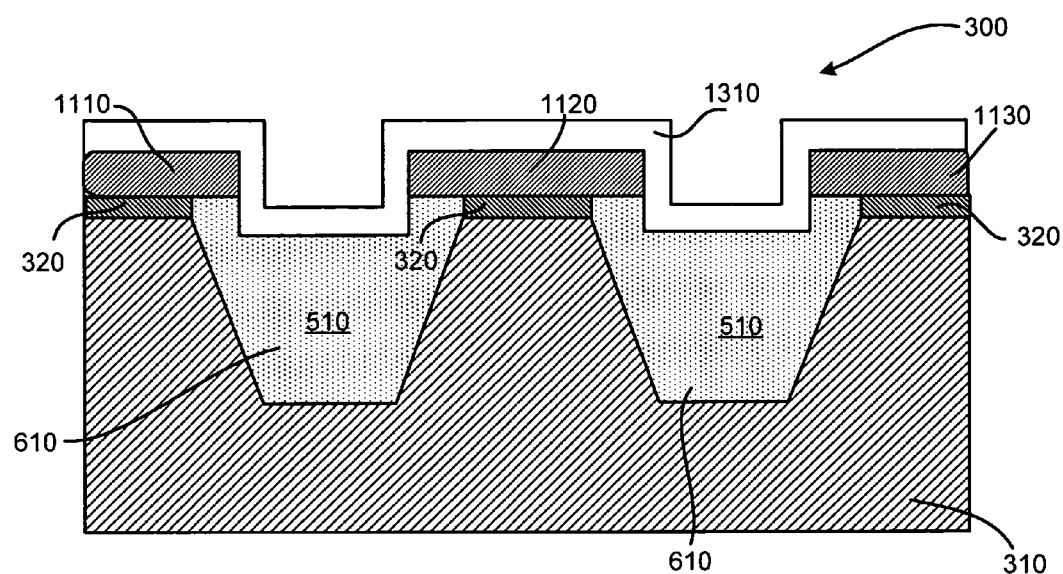
Figure 14:
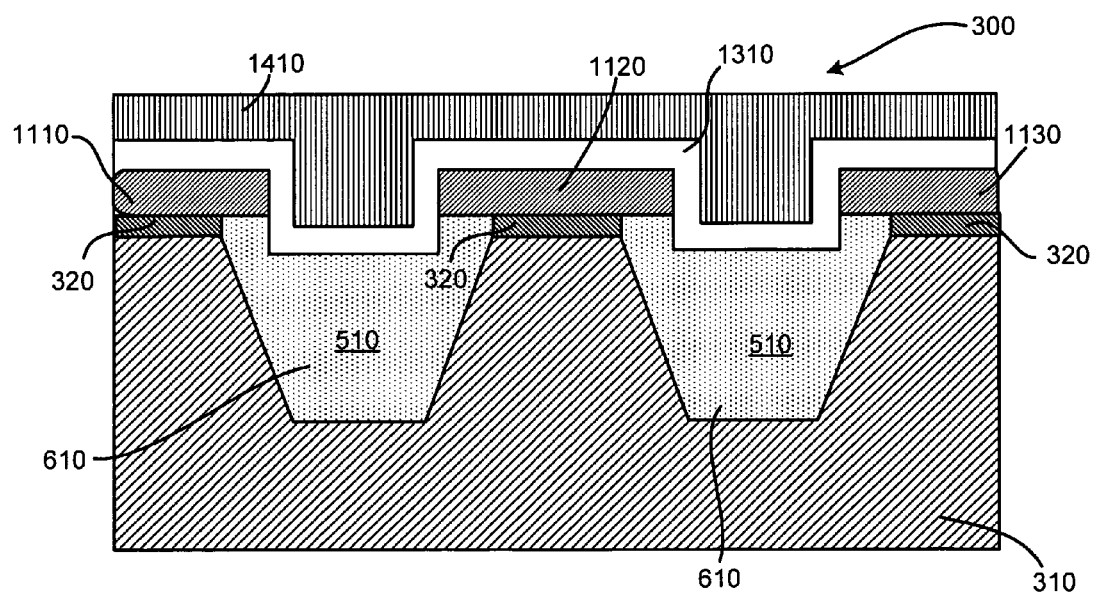

Referring to FIG. 13, an inter-gate dielectric (IGD) layer 1310 may be deposited over the etched FOX layer 610 and floating gates 1110, 1120, and 1130 (act 260). In implementations consistent with principles of the invention, inter-gate dielectric 1310 may be an oxide/nitride/oxide (ONO) stack, a nitride/oxide (NO) stack, a tantalum oxide (e.g., $Ta_2O_5$), or any suitable dielectric material. A control gate 1410 may then be formed on inter-gate dielectric 1310, as illustrated in FIG. 14 (act 265). Source/drain regions (not shown) may also be formed in substrate 310 in a conventional manner.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 2, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method for forming a memory device, comprising:
   forming a first mask layer directly over a substrate;
   forming a second mask layer directly over the first mask layer;
   etching the first mask layer and the second mask layer to form a hard mask over a first portion of the substrate;
   etching a second portion of the substrate, that is not covered by the hard mask, to form a trench;
   depositing a field oxide material over the first portion and the second portion, including filling the trench with the field oxide material;
   planarizing the field oxide material to expose a top surface of the second mask layer;
   stripping the second mask layer from the memory device using a first etching technique, where the first etching technique includes a plasma dry etching technique;
   stripping the first mask layer from the memory device using a second etching technique, where the second etching technique includes a wet chemical etching technique,
   where the second etching technique is different than the first etching technique;

forming at least two charge storage elements over opposite sides of the trench; and etching the field oxide material to form an inter-gate dielectric region positioned between an adjacent pair of the at least two charge storage elements where etching the field oxide material to form an inter-gate dielectric region, further comprises:

anisotropic dry etching the field oxide material to a particular depth extending below a lower surface of the at least two charge storage elements; and forming an inter-gate dielectric region on a top surface of the field oxide material.

2. The method of claim 1, where the wet chemical etching technique includes using phosphoric acid to strip the first mask layer from the memory device.

3. The method of claim 1, further comprising:

planarizing the field oxide material and the at least two charge storage elements prior to etching the field oxide material.

4. The method of claim 1, where the plasma dry etching technique includes using at least one fluorinated hydrocarbon gas to strip the second mask layer from the memory device, and where the fluorinated hydrocarbon gas is selected to have high selectivity to minimize field oxide etching.

5. The method of claim 4, where the plasma dry etching technique further comprises:

providing oxygen gas at a flow rate ranging from about 0 sccm to about 50 sccm; and providing trifluoromethane ($CHF_3$) gas at a flow rate ranging from about 10 sccm to about 60 sccm.

6. The method of claim 1, where the first mask layer includes a dielectric layer and the second mask layer includes an anti-reflective layer.

7. The method of claim 6, where the dielectric layer includes a nitride layer.

8. The method of claim 6, where the anti-reflective layer includes a silicon oxynitride layer.

9. The method of claim 6, where the dielectric layer has a thickness ranging from about 800 Å to about 1700 Å.

10. The method of claim 6, where the anti-reflective layer has a thickness ranging from about 300 Å to about 700 Å.

11. A method for fabricating a semiconductor device, comprising:

forming a first dielectric layer over a substrate;

forming a second dielectric layer over the first dielectric layer;

forming an anti-reflective dielectric layer over the first dielectric layer;

forming a photoresist layer over the anti-reflective dielectric layer;

patterning the photoresist layer to define mask regions;

etching the anti-reflective dielectric layer and the second dielectric layer to form a hard mask;

etching the substrate and the first dielectric layer to form at least one isolation trench in a portion of the substrate not covered by the hard mask;

depositing an oxide material over the hard mask and the portion of the substrate not covered by the hard mask, including filling the trench with the oxide material;

planarizing the oxide material to expose a top surface of the anti-reflective dielectric layer;

stripping, using a dry etching technique, the anti-reflective dielectric layer from the semiconductor device;

stripping, using a wet etching technique, the second dielectric layer from the semiconductor device;

forming at least one charge storage element over the oxide material and the first dielectric layer;

forming an inter-gate dielectric layer over the at least one charge storage element; and forming a control gate over at least a portion of the inter-gate dielectric layer.

12. The method of claim 11, further comprising;

etching the oxide material, where a top surface of the oxide material is at a depth below a lower surface of the at least one charge storage element, and where forming the inter-gate dielectric layer further includes:

forming the inter-gate dielectric layer over the top surface of the oxide material, where a portion of the inter-gate dielectric layer, over the oxide material, extends below the lower surface of the one charge storage element.

13. The method of claim 11, where the second dielectric layer includes a nitride layer and the anti-reflective dielectric layer includes a silicon oxynitride layer.

14. The method of claim 13, where stripping the anti-reflective layer comprises dry plasma etching the anti-reflective layer.

15. The method of claim 13, where stripping the second dielectric layer comprises wet phosphorous etching the second dielectric layer.

16. A method for fabricating a memory device, comprising:

forming an oxide layer over a substrate;

forming a nitride layer over the oxide layer;

forming an anti-reflective silicon oxynitride layer over the nitride layer;

patterning and etching the anti-reflective silicon oxynitride layer and the nitride layer to form a mask;

etching the oxide layer and the substrate using the mask to form at least one isolation trench;

forming a field oxide material over the substrate, including forming the field oxide material in the at least one isolation trench;

planarizing the field oxide material to expose a top surface of the anti-reflective silicon oxynitride layer;

removing the anti-reflective silicon oxynitride layer using dry plasma etching;

removing the nitride layer using wet phosphoric acid etching;

forming at least one charge storage element over the oxide layer and the field oxide material;

recessing the field oxide material to a predetermined depth using the at least one charge storage element as a mask;

forming an inter-gate dielectric layer over the at least one charge storage element and the recessed field oxide material; and forming a control gate over the inter-gate dielectric layer.

17. The method of claim 16, where the nitride layer has a thickness ranging from about 800 Å to about 1700 Å and where the anti-reflective silicon oxynitride layer has a thickness ranging from about 300 Å to about 700 Å.

18. The method of claim 16, where recessing the field oxide material to the predetermined depth includes:

recessing the field oxide material below a lower surface of the at least one charge storage element, and where forming the inter-gate dielectric layer includes:

forming the inter-gate dielectric layer over a top surface of the recessed field oxide material, where a portion of the inter-gate dielectric layer, over the recessed field oxide material, is below the lower surface of the at least one charge storage element.

* * * * *